United States Patent
Lee et al.

(10) Patent No.: US 8,778,115 B2
(45) Date of Patent: Jul. 15, 2014

(54) MASK, METHOD OF MANUFACTURING MASK AND APPARATUS FOR MANUFACTURING MASK

(75) Inventors: Choong-Ho Lee, Yongin (KR); Yoon-Chan Oh, Yongin (KR); Seung-Ho Choi, Yongin (KR); Suk-Won Jung, Yongin (KR); Jung-Soo Rhee, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 754 days.

(21) Appl. No.: 12/969,365

(22) Filed: Dec. 15, 2010

(65) Prior Publication Data

US 2011/0139357 A1 Jun. 16, 2011

(30) Foreign Application Priority Data

Dec. 15, 2009 (KR) .......................... 10-2009-0125024

(51) Int. Cl.
*B29C 65/78* (2006.01)

(52) U.S. Cl.
USPC .......................................................... 156/229

(58) Field of Classification Search
USPC ........... 156/157, 160, 163, 229, 272.2, 272.8, 156/250, 267
See application file for complete search history.

(56) References Cited

U.S. PATENT DOCUMENTS

| | | | |
|---|---|---|---|
| 6,858,086 B2 | 2/2005 | Kang | |
| 2003/0061593 A1 | 3/2003 | Yotsuya | |
| 2003/0101932 A1* | 6/2003 | Kang | 118/504 |
| 2004/0020435 A1* | 2/2004 | Tsuchiya et al. | 118/723 VE |
| 2005/0019968 A1 | 1/2005 | Kuwahara et al. | |
| 2006/0286698 A1 | 12/2006 | Kurashina | |
| 2007/0017895 A1 | 1/2007 | Yotsuya et al. | |
| 2007/0018265 A1 | 1/2007 | Koeda et al. | |
| 2009/0297768 A1* | 12/2009 | Ko | 428/136 |

FOREIGN PATENT DOCUMENTS

| | | | |
|---|---|---|---|
| JP | 2004-091830 A | | 3/2004 |
| KR | 10-2003-0026223 A | | 3/2003 |
| KR | 10-2003-0076885 A | | 9/2003 |
| KR | 1020030076885 A | * | 9/2003 |
| KR | 10-2005-0011704 A | | 1/2005 |

(Continued)

OTHER PUBLICATIONS

Korean Registration Determination Certificate issued Mar. 31, 2011 for Korean Patent Application No. KR 10-2009-0125024 which corresponds to captioned U.S. Appl. No. 12/969,365.

*Primary Examiner* — Daniel McNally
(74) *Attorney, Agent, or Firm* — Knobbe, Martens, Olson & Bear, LLP

(57) ABSTRACT

A method of efficiently manufacturing a large-sized mask is disclosed. In one embodiment, the method includes: 1) providing a first mask member comprising i) a first pattern unit having a plurality of slits, ii) a first buffer unit spaced apart from the first pattern unit, and iii) a first bonding unit interconnecting the first pattern unit and the first buffer unit and 2) providing a second mask member comprising i) a second pattern unit having a plurality of slits, ii) a second buffer unit spaced apart from the second pattern unit, and iii) a second bonding unit interconnecting the second pattern unit and the second buffer unit. The method may further include contacting the first bonding unit and the second bonding unit; and connecting the first mask member to the second mask member while tensile forces are applied to the first mask member and the second mask member.

19 Claims, 9 Drawing Sheets

(56) References Cited

FOREIGN PATENT DOCUMENTS

| | | |
|---|---|---|
| KR | 10-0647576 B1 | 11/2006 |
| KR | 10-2006-0132460 A | 12/2006 |
| KR | 10-2007-0011150 A | 1/2007 |
| KR | 10-2007-0011165 A | 1/2007 |
| KR | 10-2008-0054741 A | 6/2008 |
| KR | 10-2008-0058602 A | 6/2008 |

* cited by examiner

MASK, METHOD OF MANUFACTURING MASK AND APPARATUS FOR MANUFACTURING MASK

CROSS-REFERENCE TO RELATED PATENT APPLICATION

This application claims the benefit of Korean Patent Application No. 10-2009-0125024, filed on Dec. 15, 2009, in the Korean Intellectual Property Office, the disclosure of which is incorporated herein in its entirety by reference.

BACKGROUND OF THE INVENTION

1. Field of the Invention

The disclosed technology generally relates to a mask, and a method and apparatus for manufacturing a mask, and more particularly, to a large-sized mask, and a method and apparatus for efficiently manufacturing the large-sized mask.

2. Description of the Related Technology

Organic light-emitting displays have a large viewing angle, excellent contrast, and fast response rates, and thus have drawn attention as a next-generation display.

In general, organic light-emitting displays produce visible radiation by recombination of holes injected from an anode electrode and electrons injected from a cathode electrode in an organic emission layer.

SUMMARY OF CERTAIN INVENTIVE ASPECTS

One aspect of the present invention is a large-sized mask, and a method and apparatus for efficiently manufacturing the large-sized mask.

Another aspect is a method of manufacturing a mask, the method including: preparing a first mask member including a first pattern unit having a plurality of slits, a first buffer unit that is spaced apart from the first pattern unit, and a first bonding unit that connects the first pattern unit to the first buffer unit; preparing a second mask member including a second pattern unit having a plurality of slits, a second buffer unit that is spaced apart from the second pattern unit, and a second bonding unit that connects the second pattern unit to the second buffer unit; and connecting the first mask member to the second mask member by contacting the first bonding unit with the second bonding unit while tensile forces are applied to the first mask member and the second mask member.

The tensile forces may be applied to one end of the first mask member where the first pattern unit is disposed and the other end of the first mask member where the first buffer unit is disposed, wherein both ends face each other.

The tensile forces may be applied to one end of the second mask member where the second pattern unit is disposed and the other end of the second mask member where the second buffer unit is disposed, wherein both ends face each other.

The first and second mask members may be connected to each other by welding. The first and the second buffer units may be removed after the first and the second mask members are connected to each other.

The width of the first pattern unit may be the same as that of the second pattern unit. The first pattern unit and the first buffer unit may not be disposed on the same plane when the tensile forces are applied to the first mask member.

The first roller member may be disposed to correspond to a region where the first bonding unit meets the first buffer unit when the tensile forces are applied to the first mask member, and the first pattern unit and the first buffer unit may not be disposed on the same plane with respect to the first roller member. The second pattern unit and the second buffer unit may not be disposed on the same plane when the tensile forces are applied to the second mask member.

The second roller member may be disposed to correspond to a region where the second bonding unit meets the second buffer unit when the tensile force is applied to the second mask member, and the second pattern unit and the second buffer unit may not be disposed on the same plane with respect to the second roller member.

The first pattern unit of the first mask member and the second pattern unit of the second mask member may be disposed in a direction parallel to the direction of gravity, and tensile forces may be applied to the first mask member and the second mask member to connect the first mask member and the second mask member.

The first mask member and the second mask member may be disposed on a base substrate having a predetermined pattern, and tensile forces may be applied to the first mask member and the second mask member to connect the first mask member and the second mask member.

The base substrate may have a through-hole having a width that is greater than the width of the first mask member, and one end of the first buffer unit of the first mask member may pass through the through-hole.

The first mask member may be connected to the second mask member such that the slits of the first pattern unit and the slits of the second pattern unit are aligned to correspond to the pattern of the base substrate.

The second mask member may be disposed on the first mask member such that the second buffer unit is disposed above the first pattern unit and the second pattern unit is disposed above the first buffer unit, the distance between the first pattern unit and the second buffer unit increases and the distance between the second pattern unit and the first buffer unit increases the closer to the ends of the second buffer unit and the first buffer unit, respectively, and the first mask member is connected to the second mask member by contacting the first bonding unit with the second bonding unit while tensile forces are applied to the first mask member and the second mask member.

The first pattern unit and the second pattern unit may be disposed on the same plane after the first mask member and the second mask member are connected to each other.

The first bonding unit of the first mask member may be thinner than the first pattern unit, and the second bonding unit of the second mask member may be thinner than the second pattern unit.

The thicknesses of the first bonding unit and the second bonding unit may be reduced by etching. The total thickness of the first bonding unit and the second bonding unit may be the same as that of the first pattern unit or the second pattern unit.

The first pattern unit, the first bonding unit and the first buffer unit of the first mask member may be integrally formed, and the second pattern unit, the second bonding unit and the second buffer unit of the second mask member may be integrally formed.

The first bonding unit of the first mask member may be separately prepared and connected to the first pattern unit. The first pattern unit and the first bonding unit may be connected to each other by welding. The first bonding unit and the first buffer unit may be integrally formed.

The first bonding unit may be disposed under the first pattern unit such that one end of the first pattern overlaps one end of the first bonding unit, and the second mask member is connected to a portion of the first bonding unit where the first pattern unit and the first bonding unit do not overlap each other. The second pattern unit, the second bonding unit and the second buffer unit may be integrally formed.

Another aspect is an apparatus for manufacturing a mask, the apparatus including: a base substrate having a predetermined pattern on which a first mask member and a second mask member are disposed; a tensile member that applies tensile forces to the first mask member and the second mask member; a roller member that converts the tensile direction of the first mask member and the second mask member; and a welding member connecting the first mask member to the second mask member while tensile forces are applied to the first mask member and the second mask member.

The base substrate may include a through-hole having a width that is greater than that of the first mask member, and one end of the first mask member passes through the through-hole.

The first mask member and the second mask member may be connected to each other after the first mask member and the second mask member are disposed on the base substrate according to the pattern of the base substrate. An inner surface of the through-hole may be inclined.

Another aspect is a method of manufacturing a mask, the method comprising: providing a first mask member comprising i) a first pattern unit having a plurality of slits, ii) a first buffer unit spaced apart from the first pattern unit, and iii) a first bonding unit interconnecting the first pattern unit and the first buffer unit; providing a second mask member comprising i) a second pattern unit having a plurality of slits, ii) a second buffer unit spaced apart from the second pattern unit, and iii) a second bonding unit interconnecting the second pattern unit and the second buffer unit; contacting the first bonding unit and the second bonding unit; and connecting the first mask member to the second mask member while tensile forces are applied to the first mask member and the second mask member.

In the above method, each of the first and second mask members has first and second ends opposing each other, wherein the first ends are formed on the first and second pattern units, respectively, wherein the second ends are formed on the first and second buffer units, respectively, and wherein the tensile forces are applied to i) the first and second ends of the first mask member and ii) the first and second ends of the second mask member. The above method further comprises removing the first and the second buffer units after the first and the second mask members are connected to each other. In the above method, the width of the first pattern unit is substantially the same as that of the second pattern unit. In the above method, the tensile forces are applied to the first mask member while the first pattern unit and the first buffer unit are disposed on different planes.

The above method further comprises: providing a first roller member so as to contact at least the border region between the first bonding unit and the first buffer unit; before the tensile forces are applied to the first mask member, disposing the first pattern unit and the first buffer unit on different planes with respect to the first roller member; providing a second roller member so as to contact at least the border region between the second bonding unit and the second buffer unit; and before the tensile forces are applied to the second mask member, disposing the second pattern unit and the second buffer unit on different planes with respect to the second roller member.

The above method further comprises: disposing the first pattern unit of the first mask member and the second pattern unit of the second mask member in a direction substantially parallel to the direction of gravity, and wherein tensile forces are applied to the first mask member and the second mask member to connect the first mask member and the second mask member.

The above method further comprises: before applying the tensile forces, disposing the first mask member and the second mask member on a base substrate having a predetermined pattern, wherein a through-hole is defined in the base substrate, wherein the through-hole has a width that is greater than the width of the first mask member, and wherein one end of the first buffer unit of the first mask member passes through the through-hole. In the above method, at least part of the slits of the first pattern unit and at least part of the slits of the second pattern unit are formed substantially directly above the corresponding pattern of the base substrate.

The above method, further comprising: disposing the second buffer unit above the first pattern unit; and disposing the second pattern unit above the first buffer unit, wherein i) the distance between the first pattern unit and the second buffer unit and ii) the distance between the second pattern unit and the first buffer unit substantially gradually increase from inner ends to outer ends of the first and second buffer units, wherein the inner and outer ends are opposing each other, and wherein the inner ends of the buffer units are adjacent to the borders between the pattern units and the corresponding bonding units.

In the above method, first pattern unit and the second pattern unit are disposed on substantially the same plane after the first mask member and the second mask member are connected to each other. In the above method, the first bonding unit of the first mask member is thinner than the first pattern unit, and wherein the second bonding unit of the second mask member is thinner than the second pattern unit. In the above method, the total thickness of the first bonding unit and the second bonding unit is substantially the same as that of the first pattern unit or the second pattern unit. In the above method, the first bonding unit of the first mask member is separately prepared and connected to the first pattern unit. In the above method, the first pattern unit and the first bonding unit are connected to each other by welding.

In the above method, the first bonding unit is disposed under the first pattern unit such that one end of the first pattern overlaps one end of the first bonding unit, and wherein the second mask member is connected to a portion of the first bonding unit where the first pattern unit and the first bonding unit do not overlap each other.

Another aspect is a mask manufactured according to the above method.

Another aspect is an apparatus for manufacturing a mask, the apparatus comprising: a base substrate having a predetermined pattern on which a first mask member and a second mask member are disposed such that the first and second mask members partially contact and overlap with each other; a tensile member configured to apply tensile forces to the first mask member and the second mask member; at least one roller configured to contact at least one of the first and second mask members and configured to change the direction of the tensile forces; and a bonding member configured to connect the first mask member to the second mask member while tensile forces are applied to the first mask member and the second mask member.

In the above apparatus, a through-hole is defined in the base substrate, wherein the through-hole has a width that is greater than that of the first mask member, and wherein one end of the first mask member passes through the through-hole.

In the above apparatus, an inner surface of the through-hole is inclined. In the above apparatus, the at least one roller comprises i) a first roller configured to contact the first mask member and ii) a second roller configured to contact the second mask member, and wherein the first and second rollers are not aligned with each other in a direction substantially perpendicular to one of the first and second mask members.

DETAILED DESCRIPTION OF CERTAIN INVENTIVE EMBODIMENTS

Electrodes, organic emission layers, and organic layers of an organic light-emitting display may be formed by using various methods, one of which is a deposition method. When an organic light-emitting display is manufactured by using the deposition method, a fine metal mask (FMM) having the same pattern as a thin film to be formed is disposed to closely contact a substrate, and a thin film material is deposited over the FMM in order to form the thin film having the desired pattern. That is, a mask having substantially the same size as an organic light-emitting display is used to form a desired thin film pattern. However, it is difficult to prepare a large-sized mask with a precise pattern. Thus, it is difficult to manufacture a large-sized organic light-emitting display having desired thin film characteristics.

Hereinafter, embodiments of the present invention will now be described more fully with reference to the accompanying drawings, in which exemplary embodiments of the invention are shown.

Figure 1:
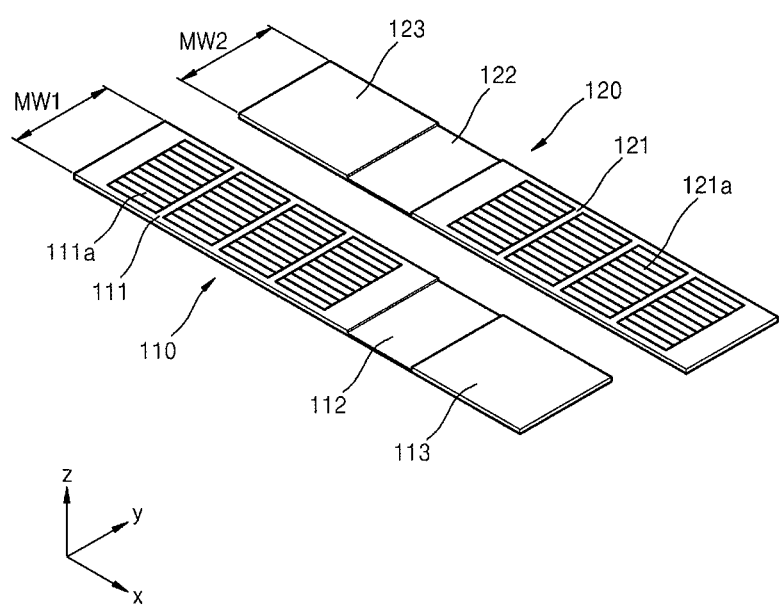
FIGS. 1 to 9 are diagrams illustrating a method of manufacturing a mask according to an embodiment.
Figure 2:
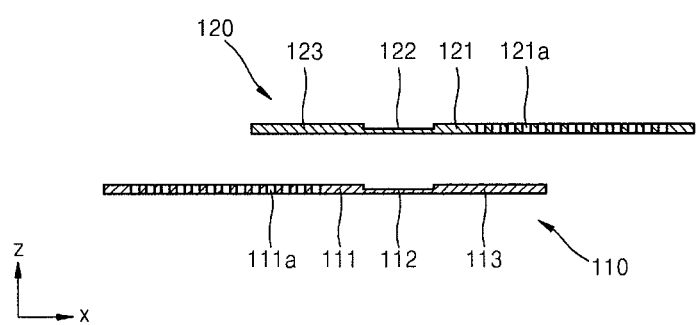

FIGS. 1 to 9 are diagrams illustrating a method of manufacturing a mask according to an embodiment of the present invention. Referring to FIGS. 1 and 2, a first mask member 110 and a second mask member 120 are prepared. FIG. 2 is a cross-sectional view of FIG. 1. The first mask member 110 includes a first pattern unit 111, a first bonding unit 112, and a first buffer unit 113.

The first pattern unit 111 includes a plurality of slits 111a. In one embodiment, the slit 111a is formed according to a desired thin film deposition pattern where deposition materials pass through the slit 111a. In one embodiment, the slits 111a have substantially the same width. Throughout the specification, the term "substantially the same" includes "the same." The first bonding unit 112 is connected to one end of the first pattern unit 111. In one embodiment, the first bonding unit 112 is thinner than the first pattern unit 111. The thickness of the first pattern unit 111 may be reduced by etching. The first buffer unit 113 is disposed at one end of the first bonding unit 112 which is opposite to the first pattern unit 111. That is, the first bonding unit 112 is disposed between the first pattern unit 111 and the first buffer unit 113.

The first mask member 110 has a width MW1 (See FIG. 1). In one embodiment, the first pattern unit 111, the first bonding unit 112, and the first buffer unit 113 have substantially the same width MW1. The first mask member 110 may be prepared using various methods. In one embodiment, the first pattern unit 111, the first bonding unit 112, and the first buffer unit 113 are integrally formed to prepare the first mask member 110. For example, the first pattern unit 111 having a plurality of slits 111a, the first bonding unit 112 having a reduced thickness, and the first buffer unit 113 may be formed by patterning a metal thin plate.

The second mask member 120 includes a second pattern unit 121, a second bonding unit 122, and a second buffer unit 123. The second pattern unit 121 includes a plurality of slits 121a. In one embodiment, the slit 121a is formed according to a desired thin film deposition pattern and deposition materials pass through the slit 121a. In one embodiment, the slits 111a have substantially the same width. The second bonding unit 122 is connected to one end of the second pattern unit 121. In one embodiment, the second bonding unit 122 is thinner than the second pattern unit 121. The thickness of the second pattern unit 121 may be reduced by etching. The second buffer unit 123 is disposed at one end of the second bonding unit 122, which is opposite to the second pattern unit 121. That is, the second bonding unit 122 is disposed between the second pattern unit 121 and the second buffer unit 123.

The second mask member 120 has a width MW2. In one embodiment, the second pattern unit 121, the second bonding unit 122, and the second buffer unit 123 have substantially the same width MW2. The width MW1 of the first mask member 110 may be substantially identical to the width MW2 of the second mask member 120. In one embodiment, the width of the first pattern unit 111 is substantially the same as that of the second pattern unit 121.

The second mask member 120 may be prepared using various methods. In one embodiment, the second pattern unit 121, the second bonding unit 122, and the second buffer unit 123 are integrally formed to prepare the second mask member 120. For example, the second pattern unit 121 having a plurality of slits 121a, the second bonding unit 122 having a reduced thickness, and the second buffer unit 123 may be formed by patterning a metal thin plate.

Figure 3:
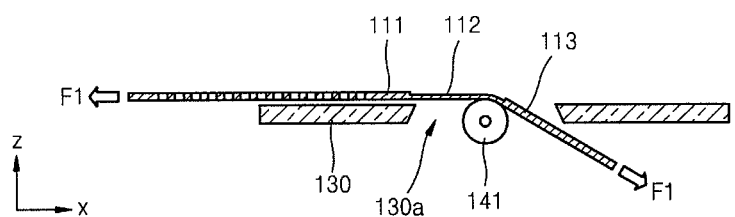

In one embodiment, tensile forces are applied to the first mask member 110 as shown in FIG. 3. In one embodiment, tensile forces are applied to both ends of the first mask member 110. For example, tensile forces are applied to one end of the first pattern unit 111 and to one end of the first buffer unit 113 which faces the other end of the first pattern unit 111 side end. For this purpose, a tensile member (not shown) that may apply tensile forces may be used. In one embodiment, substantially the same tensile forces F1 are applied to both ends of the first mask member 110.

In one embodiment, the tensile forces are applied to the first mask member 110 while the first pattern unit 111 and the first buffer unit 113 are disposed on different planes. In this embodiment, a first roller member 141 is disposed adjacent to the border region between the first bonding unit 112 and the first buffer unit 113 (See FIGS. 3-5). In one embodiment, the first pattern unit 111 is disposed on a horizontal plane, and the first buffer unit 113 is disposed to be inclined with respect to the first pattern unit 111. The first bonding unit 112 is disposed on substantially the same plane of the first pattern unit 111.

The first mask member 110 is disposed on a base substrate 130. The base substrate 130 has a predetermined pattern that may be substantially the same as the patterns of the slits of the first pattern unit 111 and the second pattern unit 121.

The base substrate 130 includes a through-hole 130a. The first pattern unit 111 is disposed on or over the base substrate 130, and at least part of the first buffer unit 113 is disposed below the base substrate 130 by the through-hole 130a.

Figure 4:
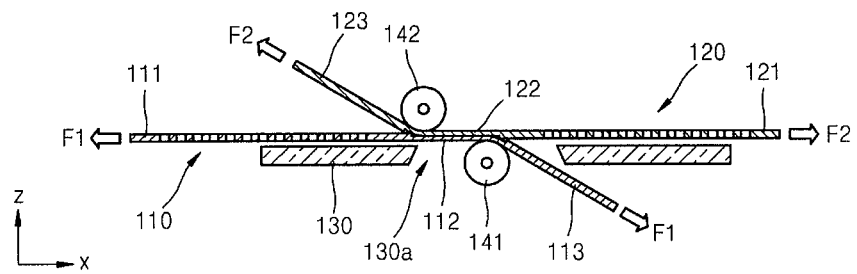

Then, tensile forces are applied to the second mask member 120 as shown in FIG. 4. The second mask member 120 is disposed on the first mask member 110. In one embodiment, the second buffer unit 123 is disposed directly above at least part of the first pattern unit 111, and at least part of the second pattern unit 121 is disposed directly above the first buffer unit 113. In this embodiment, the first bonding unit 112 and the second bonding unit 122 at least partially overlap each other.

Tensile forces are applied to both ends of the second mask member 120, for example, to one end of the second pattern unit 121 and to one end of the second buffer unit 123 which faces the other end of the second pattern unit 121. For this purpose, a tensile member (not shown) that applies tensile forces may be used. Here, substantially the same tensile forces F2 are applied to both ends of the second mask member 120.

In one embodiment, the tensile forces are applied to the second pattern unit 121 while the second pattern unit 121 and the second buffer unit 123 are disposed on different planes. In this embodiment, a second roller member 142 is disposed adjacent to the border region between the second bonding unit 122 and the second buffer unit 123. The second pattern unit 121 is disposed on a horizontal plane, and the second buffer unit 123 is disposed to be inclined with respect to the second pattern unit 121. In one embodiment, the second bonding unit 122 is disposed on substantially the same plane of the second pattern unit 121.

The second mask member 120 is disposed on or over the base substrate 130. Since a substantial portion of the first buffer unit 113 is disposed below the base substrate 130 through the through-hole 130a, the direction of the first buffer unit 113 may be different from that of the second pattern unit 121 of the second mask member 120 (e.g., inclined or crossing with respect to each other: See, for example, FIG. 4). In addition, the direction of the second buffer unit 123 may be different from that of the first pattern unit 111 due to the second roller member 142 (e.g., inclined or crossing with respect to each other: See, for example, FIG. 4).

In one embodiment, the base substrate 130 has a predetermined pattern that corresponds to the slits of a desired mask. In this embodiment, the slits 111a and 121a of the first pattern unit 111 of the first mask member 110 and the second pattern unit 121 of the second mask member 120 are aligned to correspond to or substantially directly above the pattern of the base substrate 130, and then a tensile force is applied thereto. After the alignment between the slits 111a, 121a and the base substrate pattern, the first mask member 110 and the second mask member 120 are connected to each other in a subsequent process, and thus a mask having a desired pattern may be manufactured.

Figure 5:
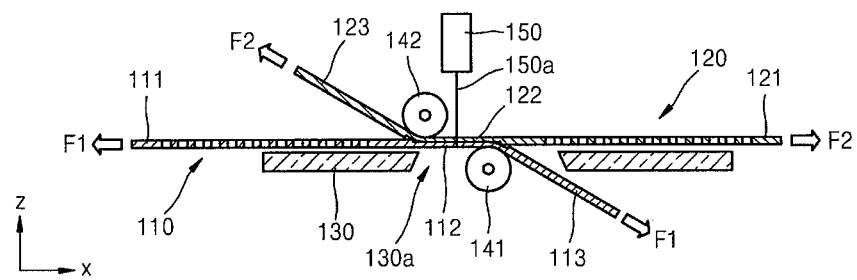
Figure 6:
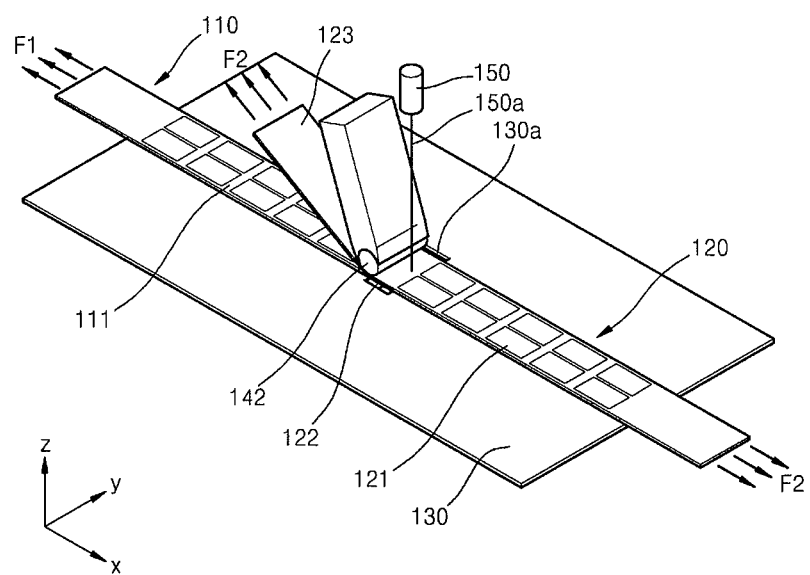
Figure 7:
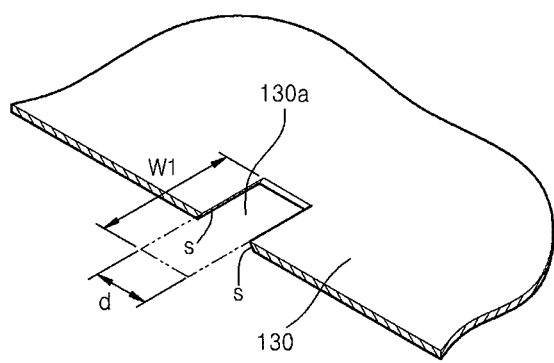
Figure 8:
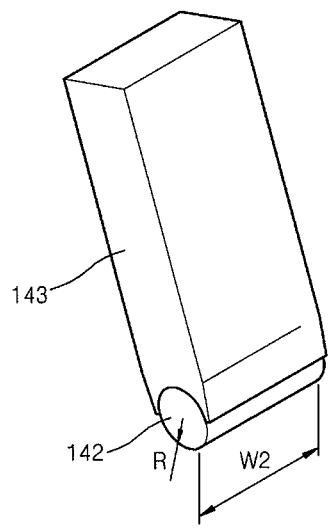

Referring to FIGS. 5 and 8, the first mask member 110 is connected to the second mask member 120 by using a welding member 150. FIG. 6 is a perspective view of FIG. 5. FIG. 7 shows a through-hole 130a of the base substrate 130 of FIG. 5. FIG. 8 shows the second roller member 142.

In this embodiment, the first bonding unit 112 of the first mask member 110 and the second bonding unit 122 of the second mask member 120 are connected to each other by welding. The welding member 150 may be a device that emits laser beams. Here, the welding member 150 irradiates a laser beam 150a to the second bonding unit 122. However, the present invention is not limited thereto, and various welding members 150 or other bonding members, in addition to the device that emits laser beams, may be used.

In one embodiment, for an efficient operation of the welding member 150, the second roller member 142 is not disposed so as not to overlap the welding member 150. That is, the second roller member 142 is not disposed at a region where the first bonding unit 112 is welded by the welding member 150 (See FIG. 5).

In one embodiment, as shown in FIG. 6, the through-hole 130a of the base substrate 130 has a greater width W1 than the width MW1 of the first mask member 110 so that the first mask member 110 passes through the through-hole 130a. In addition, the length d of the through-hole 130a may vary according to the operation conditions, but may be minimized.

An inner surface "s" of the through-hole 130a may be inclined so that the first buffer unit 113 of the first mask member 110 easily enters the through-hole 130a and extends beyond the through-hole 130a (See FIG. 7).

A width W2 of the second roller member 142 may be greater than the width MW1 of the first mask member 110 and the width MW2 of the second mask member 120 (See FIGS. 6 and 8). The second roller member 142 having low frictional resistance may be used, and the radius R of the second roller member 142 may be small enough for permanent deformation of the second mask member 120, for example, in the range of about 2 mm to about 5 mm (See FIG. 8).

A supporting unit 143 may be connected to one end of the second roller member 142. Even though not shown herein, the first roller member 141 may be formed in substantially the same shape as the second roller member 142. In addition, a supporting unit 143 is disposed to be spaced apart from the welding member 150. For this, the supporting unit 143 may be inclined to be connected to the second roller member 142.

Figure 9:
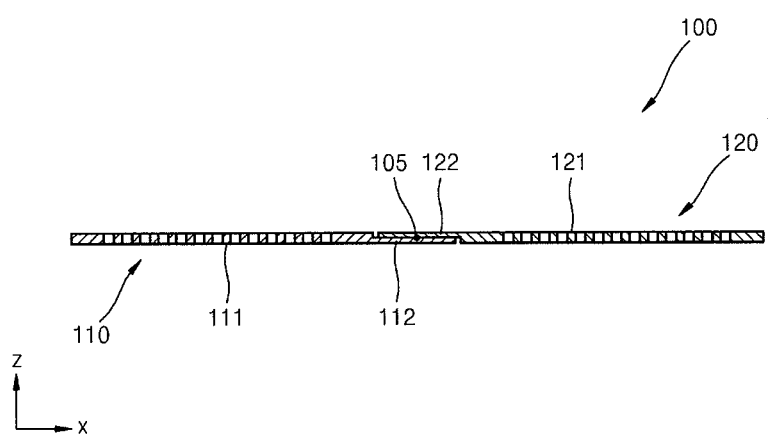

Then, as shown in FIG. 9, the first mask member 110 is connected to the second mask member 120 to prepare a mask 100. A weld point 105 is formed to connect the first bonding unit 112 and the second bonding unit 122. The first buffer unit 113 and the second buffer unit 123 are removed. A single weld point 105 may be used according to FIG. 9, but a plurality of weld points 105 may also be used.

Since the total thickness of the first bonding unit 112 and the second bonding unit 122 is substantially the same as that of the first mask member 110 or the second mask member 120, the first mask member 110 may be smoothly connected to the second mask member 120.

A large-sized mask 100 may be efficiently manufactured by connecting the first mask member 110 and the second mask member 120. In this regard, the first mask member 110 extending in both directions and the second mask member 120 extending in both directions are connected to each other, so that bonding properties of the first mask member 110 and the second mask member 120 may be improved, and slits having a desired pattern may be precisely formed.

Then, the extension directions of the first mask member 110 and the second mask member 120 are controlled by the first roller member 141 and the second roller member 142. The second mask member 120 is aligned on the first mask member 110, such that the distance between the first pattern unit 111 and the second buffer unit 123 substantially gradually increases and the distance between the second pattern unit 121 and the first buffer unit 113 substantially gradually increases from inner ends to outer ends of the second buffer unit 123 and the first buffer unit 113, respectively (see FIGS. 4 and 5). Here, the inner ends of the buffer units 113/123 are adjacent to the border between the pattern units 111/121 and the bonding units 112/122. The outer ends of the buffer units 113/123 are the other opposing ends, adjacent to the F1/F2 arrows of FIGS. 4 and 5.

Accordingly, the first bonding unit 112 of the first mask member 110 may be efficiently connected to the second bonding unit 122 of the second mask member 120, and the first pattern unit 111 may be efficiently disposed on substantially the same plane of the second pattern unit 121.

Since the first mask member 110 and the second mask member 120 are connected to each other while they are disposed on the base substrate 130 according to the pattern of the base substrate 130, a large-sized mask controller 100 having a desired pattern may be efficiently manufactured.

In addition, since one end of the first buffer unit 113 passes through the through-hole 130a of the base substrate 130, spatial convenience for performing the connection process of the first mask member 110 and the second mask member 120 may be improved.

In addition, tensile forces may be applied to one end of the first buffer unit 113 of the first mask member 110 and one end of the second buffer unit 123 of the second mask member 120, and this application of tensile forces may be efficiently performed. Furthermore, since the first buffer unit 113 and the second buffer unit 123 are removed after connecting the first mask member 110 and the second mask member 120, the first mask member 110 and the second mask member 120 may be easily processed while tensile forces are applied thereto.

Since the total thickness of the first bonding unit 112 and the second bonding unit 122 is substantially the same as that of the first pattern unit 111 or the second pattern member 121, the first pattern unit 111 is smoothly connected to the second pattern unit 121.

Figure 10:
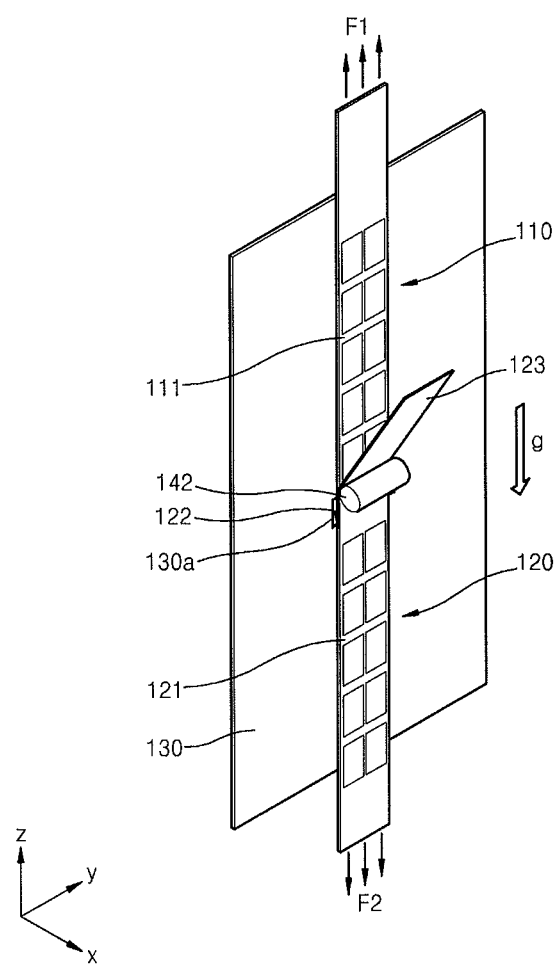
FIG. 10 is a diagram illustrating a method of manufacturing a mask according to another embodiment.

FIG. 10 is a diagram illustrating a method of manufacturing a mask according to another embodiment of the present invention. For descriptive convenience, only features that are different from the previous embodiment will be described.

Upon comparing the previous and present embodiments, only the directions of extending the first and second mask members 110 and 120 are different from each other.

The arrow g of FIG. 10 indicates the direction of gravity. Referring to FIG. 10, the first pattern unit 111 and the second pattern unit 122 are substantially aligned in the direction of gravity, and tensile forces are applied to the first mask member 110 and the second mask member 120 to connect the first mask member 110 and the second mask member 120.

While a deposition process is performed on a substrate to be deposited using a mask, the substrate and the mask may be substantially vertically aligned, i.e., the substrate and the mask may be aligned substantially parallel to the direction of gravity. In particular, for a large-sized substrate and mask, this alignment may be used.

If a deposition process is performed in such an alignment, the mask is gradually deformed by gravity, and thus the thin film characteristics of the substrate may deteriorate.

According to the present embodiment, the first pattern unit 111 of the first mask member 110 and the second pattern unit 112 of the second mask member 120 are aligned in a direction substantially parallel to the direction of gravity, and then tensile forces are applied thereto to connect the first mask member 110 and the second mask member 120, thereby manufacturing the mask 100. Accordingly, if the mask 100 and the substrate are substantially aligned in the direction of gravity and the deposition process is performed, gravity may be compensated to inhibit the deformation of the mask 100.

Figure 11:
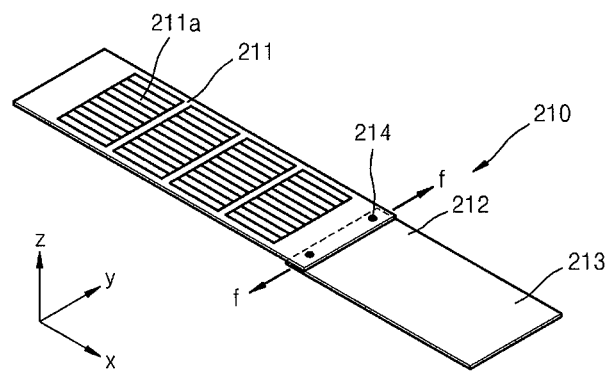
FIGS. 11 to 17 are diagrams illustrating a method of manufacturing a mask according to another embodiment.
Figure 12:
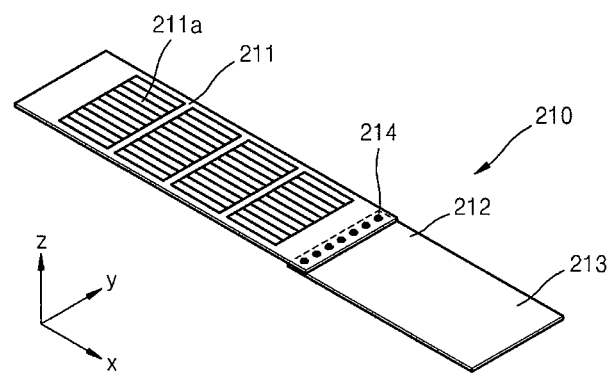
Figure 13:
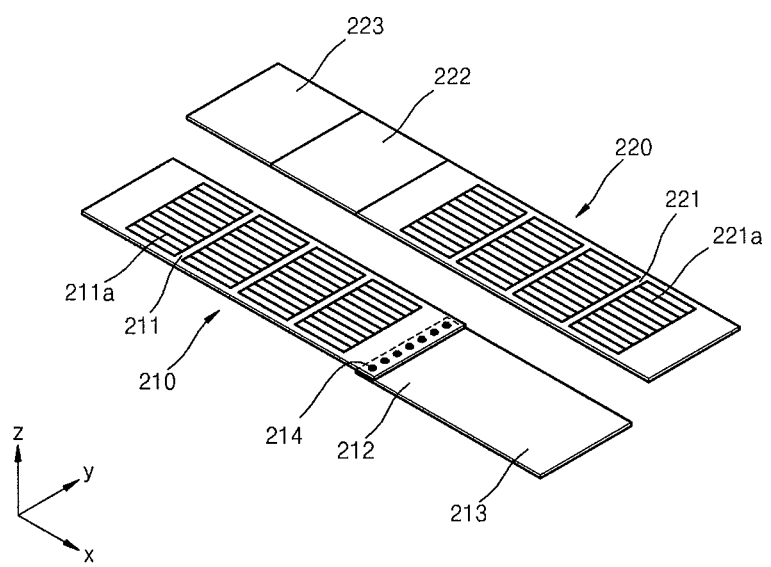
Figure 14:
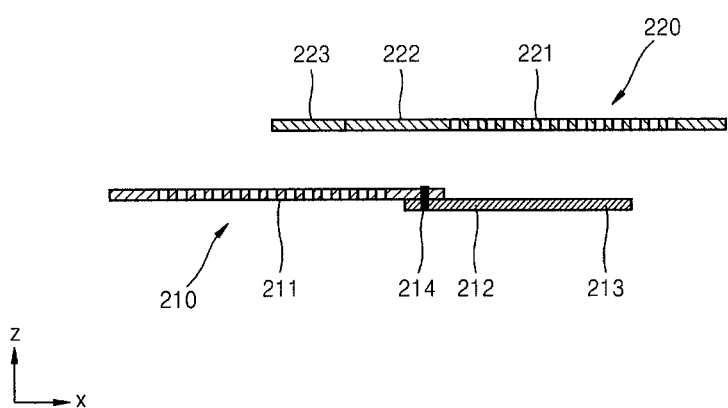

FIGS. 11 to 17 are diagrams illustrating a method of manufacturing a mask according to another embodiment of the present invention. Referring to FIGS. 11 and 14, a first mask member 210 and a second mask member 220 are prepared. FIG. 14 is a cross-sectional view of FIG. 13. The first mask member 210 includes a first pattern unit 211, a first bonding unit 212, and a first buffer unit 213. The first pattern unit 211 includes a plurality of slits 211a. For example, the slit 211a is formed according to a desired thin film deposition pattern and deposition materials pass through the slit 211a The first bonding unit 212 is connected to one end of the first pattern unit 211. The first bonding unit 212 is separately formed from the first pattern unit 211 and connected to the first pattern unit by, for example, welding. The first bonding unit 212 is disposed under the first pattern unit 211 such that one end of the first pattern unit 211 overlaps one end of the first bonding unit 212. Then, the first bonding unit 212 is connected to the first pattern unit 211 by a weld point 214. Here, a welding process is performed while tensile forces f are applied to both ends of the overlap of the first bonding unit 212 and the first pattern unit 211, i.e., in a direction substantially perpendicular to the direction of the first mask member 110. Accordingly, bonding properties of the first pattern unit 211 and the first bonding unit may be improved. A plurality of weld points 214 may be used.

The first buffer unit 213 is disposed at one end of the first bonding unit 212. One end of the first bonding unit 212 extends to form the first buffer unit 213. That is, the first bonding unit 212 and the first buffer unit 213 are integrally formed. Thus, the first bonding unit 212 is disposed between the first pattern unit 211 and the first buffer unit 213.

The second mask member 220 includes a second pattern unit 221, a second bonding unit 222, and a second buffer unit 223. The second pattern unit 221 includes a plurality of slits 221a. The second bonding unit 222 is connected to one end of the second pattern unit 221, and the second buffer unit 223 is disposed at one end of the second bonding unit 222 which is opposite to the second pattern unit 221. That is, the second bonding unit 222 is disposed between the second pattern unit 221 and the second buffer unit 223. In this regard, the second pattern unit 221, the second bonding unit 222, and the second buffer unit 223 are integrally formed.

Figure 15:
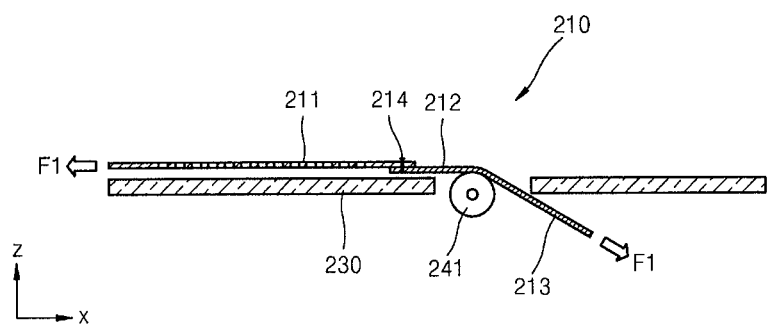

Then, tensile forces are applied to the first mask member 210 as shown in FIG. 15. Tensile forces are applied to both ends of the first mask member 210, i.e., to the first pattern unit 211 side end and the first buffer unit 213 side end facing the first pattern unit 111 side end. Here, substantially the same tensile forces F1 are applied to both ends of the first mask member 210.

The tensile forces are applied to the first mask member 210 while the first pattern unit 211 and the first buffer unit 213 are disposed on different planes. For this, a first roller member 241 is disposed to correspond to a region where the first bonding unit 212 meets the first buffer unit 213. The first pattern unit 211 is disposed on a horizontal plane, and the first buffer unit 213 is disposed to be inclined with respect to the first pattern unit 211.

The first mask member 210 is disposed on a base substrate 230 having a predetermined pattern. The base substrate 230 includes a through-hole 230a.

Figure 16:
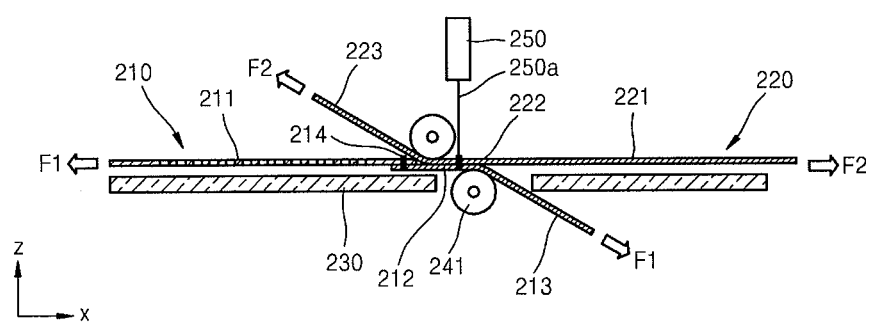

Then, tensile forces are applied to the second mask member 220 as shown in FIG. 16. The second mask member 220 is disposed on the first mask member 210 such that the second buffer unit 223 is disposed to correspond to the first pattern unit 211, the second pattern unit 221 is disposed to correspond to the first buffer unit 213, and the first bonding unit 212 and the second bonding unit 222 overlap each other.

Tensile forces are applied to both ends of the second mask member 220, i.e., the second pattern unit 221 side end and the second buffer unit 223 side end facing the second pattern unit 211 side end. Here, substantially the same tensile forces F2 are applied to the both ends of the second mask member 220.

The tensile forces are applied to the second mask member 220 while the second pattern unit 221 and the second buffer unit 223 are disposed on different planes. For this, a second roller member 242 is disposed to correspond to a region where the second bonding unit 222 meets the second buffer unit 223. The second pattern unit 221 is disposed on a horizontal plane, and the second buffer unit 223 is disposed to be inclined with respect to the second pattern unit 221.

The second mask member 220 is disposed on the base substrate 230. Then, the first mask member 210 is connected to the second mask member 220 using a welding member

250. Specifically, the first bonding unit 212 of the first mask member 210 and the second bonding unit 222 of the second mask member 220 are connected to each other by welding. The welding member 250 may be a laser device emitting laser beams 250*a*.

Figure 17:
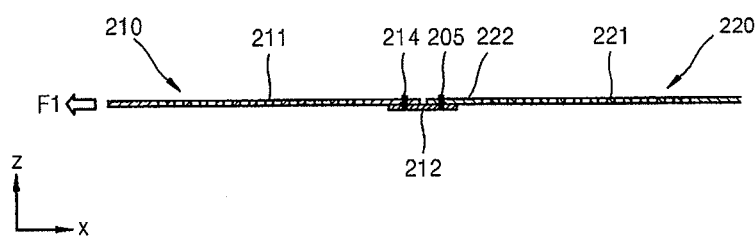

Then, as shown in FIG. 17, the first mask member 210 is connected to the second mask member 220 to prepare a mask 200. A weld point 205 is formed to connect the first bonding unit 212 and the second bonding unit 222. The first buffer unit 213 and the second buffer unit 223 are removed.

Since the first pattern unit 211 and the second pattern unit 221 are disposed on substantially the same plane, the first pattern unit 211 may be smoothly connected to the second pattern unit 221. Even though not shown herein, the mask member may be aligned in the direction of gravity as shown in FIG. 10. The base substrate 230, and the first and second roller member 241 and 242 are described above, and thus descriptions thereof will not be repeated.

According to the present embodiment, a large-sized mask 200 may be efficiently manufactured. In this regard, the first mask member 210 extending in both directions and the second mask member 220 extending in both directions are connected to each other, so that bonding properties of the first mask member 210 and the second mask member 220 may be improved, and a mask 200 having a precise pattern may be efficiently manufactured.

Since directions in which the first mask member 210 and the second mask member 220 extend are controlled by the first roller 241 and the second roller 242, the first pattern unit 211 and the second pattern unit 221 are efficiently disposed on the same plane, and thus efficiency of the process may be improved.

In addition, a large-sized mask 200 having a desired pattern may be efficiently manufactured using the base substrate 230, and spatial convenience for the connection process may be improved by the through-hole 230*a* that is formed in the base substrate 230. Furthermore, since the first buffer unit 213 and the second buffer unit 223 are removed after the application of the tensile forces, efficiency may be improved.

The first mask member 210 may be efficiently prepared by separately connecting the first bonding unit 212 to the first pattern unit 211. A mask 200 having the first pattern unit 211 and the second pattern unit 221 which are disposed on substantially the same plane by connecting the first bonding unit 212 to the first pattern unit 211 by overlapping one end of the first bonding unit and one end of the first pattern unit 211, and connecting the second bonding unit 222 of the second mask member 220 to a portion of the first bonding unit 212 where the first pattern unit 211 and the first bonding unit 212 do not overlap each other.

According to at least one embodiment of the present invention, a large-sized mask may be efficiently manufactured using the method and apparatus for efficiently manufacturing the mask.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a mask, the method comprising:
providing a first mask member comprising i) a first pattern unit having a plurality of slits, ii) a first buffer unit spaced apart from the first pattern unit, and iii) a first bonding unit interconnecting the first pattern unit and the first buffer unit;
providing a second mask member comprising i) a second pattern unit having a plurality of slits, ii) a second buffer unit spaced apart from the second pattern unit, and iii) a second bonding unit interconnecting the second pattern unit and the second buffer unit;
contacting the first bonding unit and the second bonding unit; and
connecting the first mask member to the second mask member while tensile forces are applied to the first mask member and the second mask member, wherein the tensile forces are applied to the first mask member while the first pattern unit and the first buffer unit are formed on different planes.

2. The method of claim 1, further comprising: before applying the tensile forces, disposing the first mask member and the second mask member on a base substrate having a predetermined pattern,
wherein a through-hole is defined in the base substrate, wherein the through-hole has a width that is greater than the width of the first mask member, and wherein one end of the first buffer unit of the first mask member passes through the through-hole.

3. The method of claim 2, wherein at least part of the slits of the first pattern unit and at least part of the slits of the second pattern unit are formed substantially directly above the corresponding pattern of the base substrate.

4. The method of claim 1, wherein each of the first and second mask members has first and second ends opposing each other, wherein the first ends are formed on the first and second pattern units, respectively, wherein the second ends are formed on the first and second buffer units, respectively, and wherein the tensile forces are applied to i) the first and second ends of the first mask member and ii) the first and second ends of the second mask member.

5. The method of claim 1, further comprising removing the first and the second buffer units after the first and the second mask members are connected to each other.

6. The method of claim 1, wherein the width of the first pattern unit is substantially the same as that of the second pattern unit.

7. The method of claim 1, further comprising:
providing a first roller member so as to contact at least the border region between the first bonding unit and the first buffer unit;
before the tensile forces are applied to the first mask member, disposing the first pattern unit and the first buffer unit on different planes with respect to the first roller member;
providing a second roller member so as to contact at least the border region between the second bonding unit and the second buffer unit; and
before the tensile forces are applied to the second mask member, disposing the second pattern unit and the second buffer unit on different planes with respect to the second roller member.

8. The method of claim 1, further comprising: disposing the first pattern unit of the first mask member and the second pattern unit of the second mask member in a direction substantially parallel to the direction of gravity, and wherein tensile forces are applied to the first mask member and the second mask member to connect the first mask member and the second mask member.

9. The method of claim 1, further comprising:
disposing the second buffer unit above the first pattern unit; and
disposing the second pattern unit above the first buffer unit, wherein i) the distance between the first pattern unit and the second buffer unit and ii) the distance between the second pattern unit and the first buffer unit substantially gradually increase from inner ends to outer ends of the first and second buffer units, wherein the inner and outer ends are opposing each other, and wherein the inner ends of the buffer units are adjacent to the borders between the pattern units and the corresponding bonding units.

10. The method of claim 1, wherein the first pattern unit and the second pattern unit are disposed on substantially the same plane after the first mask member and the second mask member are connected to each other.

11. The method of claim 1, wherein the first and second mask members are connected to each other by welding.

12. A method of manufacturing a mask, the method comprising:
providing a first mask member comprising i) a first pattern unit having a plurality of slits, ii) a first buffer unit spaced apart from the first pattern unit, and iii) a first bonding unit interconnecting the first pattern unit and the first buffer unit;
providing a second mask member comprising i) a second pattern unit having a plurality of slits, ii) a second buffer unit spaced apart from the second pattern unit, and iii) a second bonding unit interconnecting the second pattern unit and the second buffer unit;
contacting the first bonding unit and the second bonding unit; and
connecting the first mask member to the second mask member while tensile forces are applied to the first mask member and the second mask member,
wherein the first bonding unit of the first mask member is separately prepared and connected to the first pattern unit.

13. The method of claim 12, wherein the first pattern unit and the first bonding unit are connected to each other by welding.

14. The method of claim 12, wherein the first bonding unit is disposed under the first pattern unit such that one end of the first pattern overlaps one end of the first bonding unit, and wherein the second mask member is connected to a portion of the first bonding unit where the first pattern unit and the first bonding unit do not overlap each other.

15. The method of claim 12, wherein the first bonding unit and the first buffer unit are integrally formed.

16. The method of claim 12, wherein the second pattern unit, the second bonding unit and the second buffer unit are integrally formed.

17. A method of manufacturing a mask, the method comprising:
providing a first mask member comprising i) a first pattern unit having a plurality of slits, ii) a first buffer unit spaced apart from the first pattern unit, and iii) a first bonding unit interconnecting the first pattern unit and the first buffer unit;
providing a second mask member comprising i) a second pattern unit having a plurality of slits, ii) a second buffer unit spaced apart from the second pattern unit, and iii) a second bonding unit interconnecting the second pattern unit and the second buffer unit;
contacting the first bonding unit and the second bonding unit; and
connecting the first mask member to the second mask member while tensile forces are applied to the first mask member and the second mask member,
wherein the first bonding unit of the first mask member is thinner than the first pattern unit, and wherein the second bonding unit of the second mask member is thinner than the second pattern unit.

18. The method of claim 17, wherein the total thickness of the first bonding unit and the second bonding unit is substantially the same as that of the first pattern unit or the second pattern unit.

19. The method of claim 17, wherein the first pattern unit, the first bonding unit and the first buffer unit of the first mask member are integrally formed, and the second pattern unit, the second bonding unit and the second buffer unit of the second mask member are integrally formed.

* * * * *